(12) United States Patent
Yang et al.

(10) Patent No.: US 8,093,851 B2
(45) Date of Patent: Jan. 10, 2012

(54) FAN MODULE AND SYSTEM

(75) Inventors: Jia-Lin Yang, Taipei (TW); Fou-Ming Liou, Taipei (TW)

(73) Assignee: Asustek Computer Inc., Peitou, Taipei (TW)

( * ) Notice: Subject to any disclaimer, the term of this patent is extended or adjusted under 35 U.S.C. 154(b) by 348 days.

(21) Appl. No.: 12/546,001

(22) Filed: Aug. 24, 2009

(65) Prior Publication Data

US 2010/0060221 A1 Mar. 11, 2010

(30) Foreign Application Priority Data

Sep. 10, 2008 (TW) .............................. 97134682 A

(51) Int. Cl.
*H02H 7/08* (2006.01)
(52) U.S. Cl. ............ 318/478; 318/445; 318/34; 318/53; 318/54; 318/55
(58) Field of Classification Search .................. 318/478, 318/445, 34, 53–55, 59
See application file for complete search history.

(56) References Cited

U.S. PATENT DOCUMENTS 6,225,809 B1 * 5/2001 Watano et al. ................ 324/464
6,545,438 B1 * 4/2003 Mays, II .................. 318/400.01

FOREIGN PATENT DOCUMENTS

TW 00214254 6/1982
TW 00341412 7/1986

OTHER PUBLICATIONS

English language translation of abstract of TW 00214254, Jun. 25, 1982.
English language translation of abstract of TW 00341412, Jul. 14, 1986.

* cited by examiner

*Primary Examiner* — Walter Benson
*Assistant Examiner* — David Luo
(74) *Attorney, Agent, or Firm* — Thomas|Kayden

(57) ABSTRACT

A fan module, especially a fan module which may reduce a rotating speed of a fan automatically when an object with static electricity gets into the fan is provided. The fan module includes a frame, a fan, an electrostatic induction unit and a controller. The fan is disposed in the frame, and the electrostatic induction unit is disposed on the frame and adjacent to the fan. The controller is electrically coupled to the electrostatic induction unit. When an object with static electricity gets into the electrostatic induction unit, the electrostatic induction unit outputs a sensing value to the controller. The controller determines whether to reduce the rotating speed of the fan according to the sensing value.

15 Claims, 2 Drawing Sheets

FAN MODULE AND SYSTEM

This application claims the benefit of Taiwan application Serial No. 97134682, filed Sep. 10, 2008, the subject matter of which is incorporated herein by reference.

BACKGROUND OF THE INVENTION

1. Field of the Invention

The invention relates to a fan module and system and, more particularly, to a fan module and system which may reduce a rotating speed of a fan automatically when an object with static electricity gets into the fan.

2. Description of the Related Art

In a computer system, heat dissipating efficiency is one of important factors affecting the stableness and efficacy. If the temperature of elements in a computer casing is too high, the operation of the computer system is affected, and for example, reading a hard disk cannot be performed successfully. To dissipate heat generated by the elements fast, the computer system is usually equipped with a fan to be a heat dissipating device to allow the computer system to work normally at proper environment temperature.

To achieve preferable heat dissipating effect, the fan usually rotates at a high speed. However, if a user touches the fan with the high speed by his finger unintentionally, the finger may be injured by the fan blades. In the conventional fan module, a reticulation impediment is disposed on the fan to prevent the user's finger from touching the fan. However, the reticulation impediment increases the volume of the fan module. Furthermore, since dust may accumulate on the reticulation impediment, the air output is affected, and then the heat dissipating efficiency of the fan module is affected.

BRIEF SUMMARY OF THE INVENTION

The invention relates to a fan module and system which may reduce a rotating speed of a fan automatically when an object with static electricity gets into the fan. This may prevent a user's finger from being cut by the rotating fan, and the safety of the fan module and system is improved.

According to the first aspect of the invention, a fan module is provided. The fan module includes a frame, a fan, an electrostatic induction unit and a controller. The fan is disposed in the frame. The electrostatic induction unit is disposed on the frame and adjacent to the fan. The controller is electrically coupled to the electrostatic induction unit. When an object with static electricity gets into the electrostatic induction unit, the electrostatic induction unit outputs a sensing value to the controller. The controller determines whether to reduce a rotating speed of the fan according to the sensing value.

According to the second aspect of the invention, a fan system is provided. The fan system includes a circuit board, a fan, an electrostatic induction unit and a controller. The fan is electrically coupled to the circuit board. The electrostatic induction element is disposed on the circuit board and adjacent to the fan. The controller is electrically coupled to the electrostatic induction element. When an object with static electricity gets into the electrostatic induction element, the electrostatic induction element outputs a sensing value to the controller. The controller determines whether to reduce a rotating speed of the fan according to the sensing value.

These and other features, aspects and advantages of the present invention will become better understood with regard to the following description, appended claims, and accompanying drawings.

DETAILED DESCRIPTION OF THE EMBODIMENTS

Figure 1:
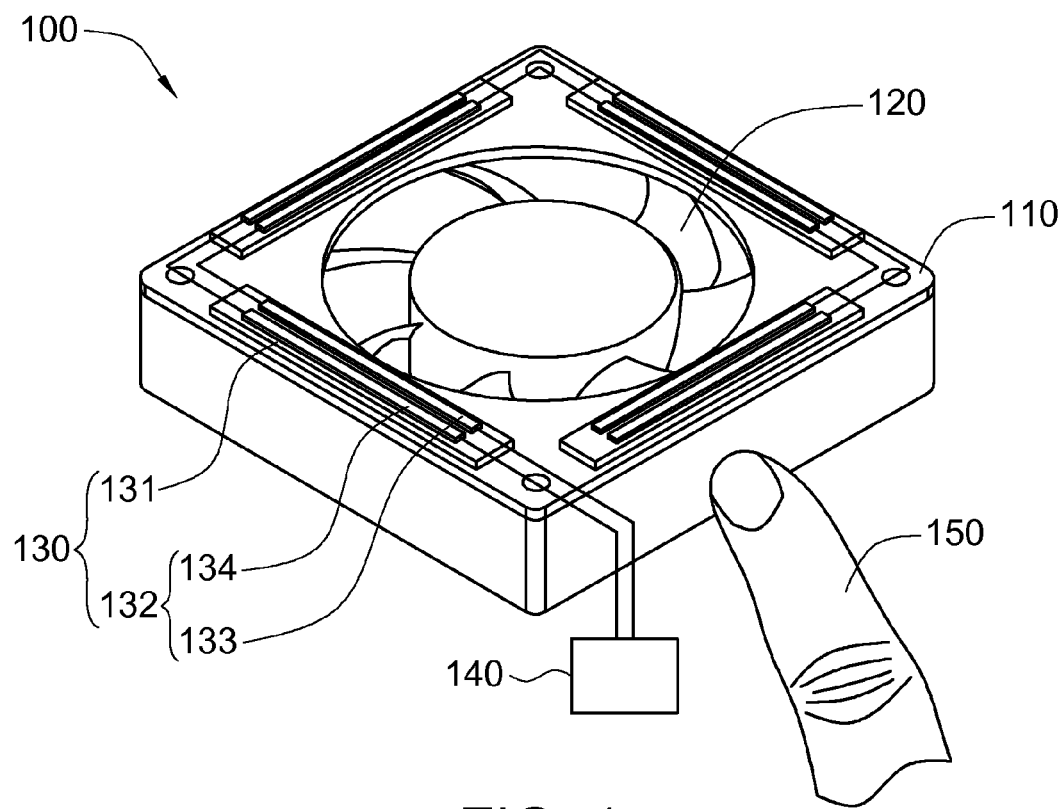
FIG. 1 is a schematic diagram showing a fan module in an embodiment of the invention.

The invention is dedicated to preventing a user from being cut by a fan to reduce the danger in use and maintain preferable heat dissipating effect. FIG. 1 is a schematic diagram showing a fan module in an embodiment of the invention. As shown in FIG. 1, the fan module 100 may be disposed in an electronic product to dissipate heat generated by an electronic element. For example, the fan module 100 is disposed in a computer system to dissipate heat generated by the central processing unit (CPU). The fan module 100 includes a frame 110, a fan 120, a plurality of electrostatic induction units 130 (which includes a first electrostatic induction unit and a plurality of second electrostatic induction units) and a controller 140.

The fan 120 is disposed in the frame 110. The electrostatic induction unit 130 (the first electrostatic induction unit) is disposed on the frame 110 and adjacent to the fan 120. The controller 140 is electrically connected to the electrostatic induction unit 130. When an object with static electricity 150 gets into the electrostatic induction unit 130, the electrostatic induction unit 130 outputs a sensing value Sv to the controller 140. The controller 140 determines whether to reduce a rotating speed of the fan according to the sensing value Sv. When the controller 140 determines that the sensing value Sv is greater than a threshold value Th, the controller 140 reduces the rotating speed of the fan 120. The object with static electricity 150 may be a user's finger. Thus, when the user's finger gets into the fan 120 with the high speed, the controller 140 reduces the rotating speed of the fan 120 to prevent the user's finger from being injured by the fan 120. Preferably, when the sensing value Sv is greater than the threshold value Th, the controller 140 may turn off the fan 120 directly to provide further protection.

In the embodiment, the fan module 100 includes four electrostatic induction units 130. In other embodiments, the number of the electrostatic induction units 130 is not limited to be four. In actual application, the fan module may include one, two, or three electrostatic induction units or more than four electrostatic induction units. In addition, in the embodiment, the electrostatic induction units 130 are disposed around the fan 120. Thus, the electrostatic induction units 130 may detect the object with static electricity 150 getting into the fan 120 in any direction, and the rotating speed of the fan 120 is reduced.

Figure 2:
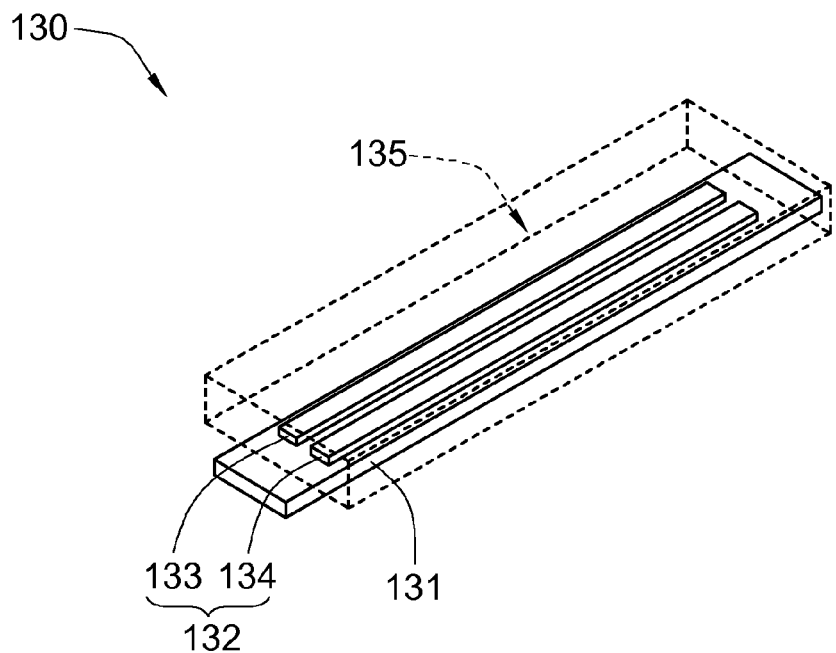
FIG. 2 is a schematic diagram showing the electrostatic induction unit in FIG. 1.

FIG. 2 is a schematic diagram showing the electrostatic induction unit in FIG. 1. As shown in FIG. 2, the electrostatic induction unit 130 includes a carrier 131 and an electrostatic induction element 132. The carrier 131 may be a circuit board or a flexible printed circuit board. The electrostatic induction element 132 may be disposed on the carrier 131 and coupled to the controller 140.

In the embodiment, the electrostatic induction element 132 may be a capacitive sensor. The capacitive sensor includes two metal conductors such as two copper foils 133 and 134, which are used as a capacitor. The strip-shaped copper foils 133 and 134 may be parallel with each other. When the object with static electricity 150 gets into a sensing area 135 of the electrostatic induction element 132, the electrostatic induction element 132 senses an equivalent capacitance value between the two copper foils 133 and 134 to generate the sensing value. A capacity effect exists between the copper foils 133 and 134 and the object with static electricity 150. Thus, the equivalent capacitance value between the copper foils 133 and 134 increases. In the embodiment, the equivalent capacitance value corresponds to the sensing value Sv. The controller 140 determines whether the object with static electricity 150 gets into the fan 120 according to the equivalent capacitance value to determine whether to reduce the rotating speed of the fan 120 or whether to turn off the fan 120.

In the embodiment, the controller 140 may be disposed on the frame 110, in the frame 110 or outside the frame 110. In addition, when only the electrostatic induction element 132 is used, the shape of the copper foils 133 and 134 may be a ring, a rectangle or a polygon around the fan.

The fan 120 is driven by a fan driving signal. The controller 140 is used to generate the fan driving signal to control the rotating speed of the fan 120. When the sensing value Sv is greater than the threshold value Th, the controller 140 changes the fan driving signal to reduce the rotating speed of the fan 120. In the embodiment, the controller 140 includes a pulse width modulation (PWM) circuit for generating the fan driving signal and controlling the pulse width or duty cycle of the fan driving signal to control the rotating speed of the fan 120.

In the embodiment, the fan module 100 having the electrostatic induction unit 130 disposed on the frame 110 is taken as an example. However, the position of the electrostatic induction unit is not limited thereto, and another embodiment is taken as an example hereinbelow.

Figure 3:
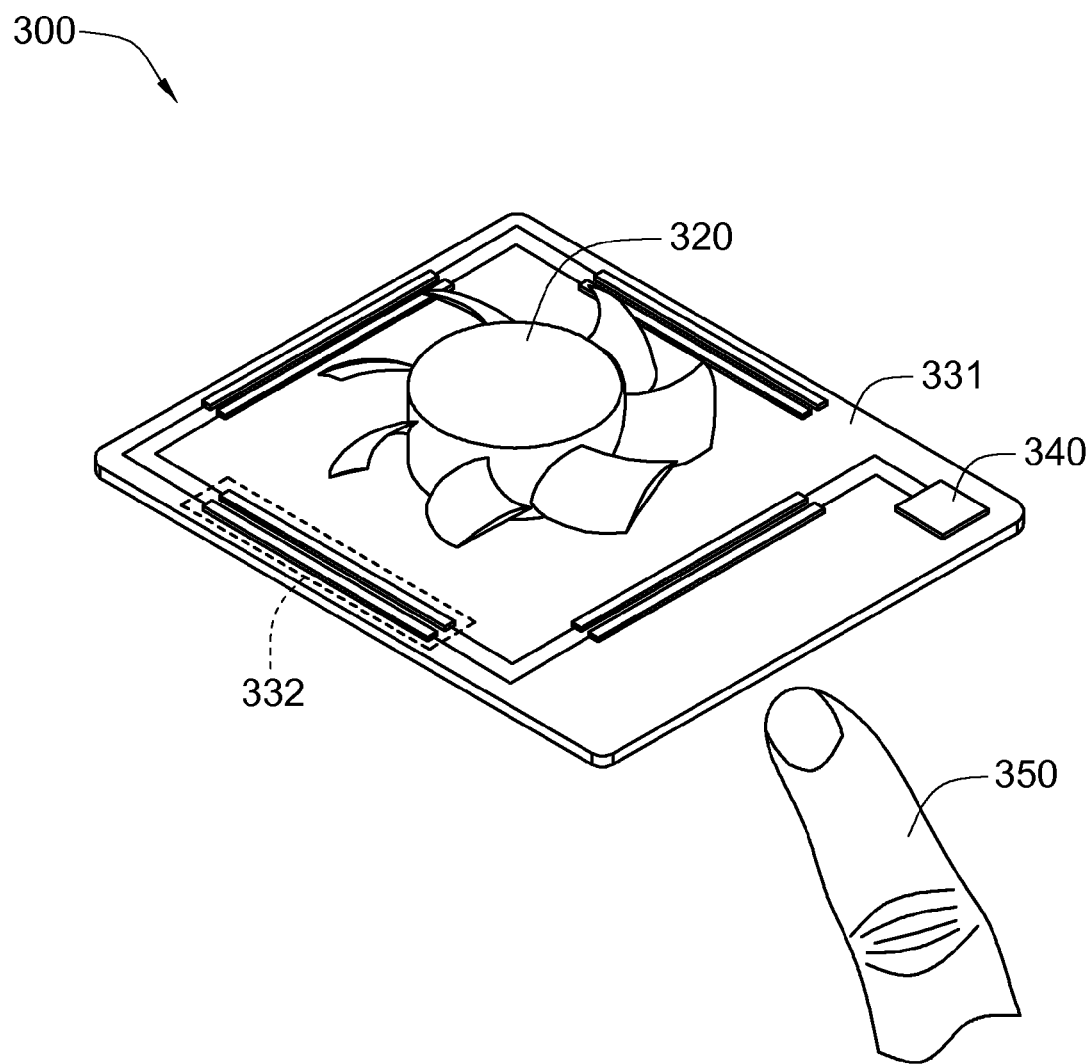
FIG. 3 is a schematic diagram showing a fan system in another embodiment of the invention.

FIG. 3 is a schematic diagram showing a fan system in another embodiment of the invention. As shown in FIG. 3, the differences between the fan system 300 and the fan module 100 are that a plurality of electrostatic induction elements 332 and the fan 320 of the fan system 300 are electrically coupled to a circuit board 331, and the electrostatic induction element 332 is adjacent to the fan 320. Thus, when the object with static electricity 350 gets into the electrostatic induction element 332, the electrostatic induction element 332 generates a sensing value Sv. When the sensing value Sv is greater than the threshold value Th, the controller 340 reduces the rotating speed of the fan 320.

In the embodiment, the fan 320 of the fan system 300 is directly disposed on the circuit board 331. However, in other embodiments, the fan 320 also may be disposed in the hole at the center of the circuit board 331, and the electrostatic induction elements 332 are disposed around the hole and adjacent to the fan 320. Other aspects which are the same as the fan module 100 are not illustrated herein.

In the fan module and system according to the embodiment of the invention, the electrostatic induction unit is disposed adjacently to the fan. When the object with static electricity gets into the sensing area of the electrostatic induction unit, the electrostatic induction unit senses the quantity of electric charge or the voltage value of the object with static electricity to generate the sensing value. When the sensing value is greater than the threshold value, the controller reduces the rotating speed of the fan or turns off the fan. This may prevent the user from being cut by the fan with the high rotating speed to reduce the danger in use and further improve the safety of the fan module and system.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A fan module comprising:
a frame;
a fan disposed in the frame;
a first electrostatic induction unit disposed on the frame and adjacent to the fan; and
a controller electrically coupled to the first electrostatic induction unit;
wherein when an object with static electricity gets into the first electrostatic induction unit, the first electrostatic induction unit outputs a sensing value to the controller, and the controller determines whether to reduce a rotating speed of the fan according to the sensing value.

2. The fan module according to claim 1, wherein when the controller determines that the sensing value is greater than a threshold value, the controller reduces the rotating speed of the fan.

3. The fan module according to claim 1, further comprising a plurality of second electrostatic induction units, wherein the first electrostatic induction unit and the second electrostatic induction units are disposed around the fan.

4. The fan module according to claim 1, wherein the first electrostatic induction unit comprises:
a carrier; and
an electrostatic induction element disposed on the carrier and electrically coupled to the controller.

5. The fan module according to claim 4, wherein the electrostatic induction element comprises two copper foils, and the two copper foils are strip-shaped and substantially parallel with each other.

6. The fan module according to claim 5, wherein when the object with static electricity gets into a sensing area of the first electrostatic induction unit, the first electrostatic induction unit senses an equivalent capacitance value between the two copper foils to generate the sensing value.

7. The fan module according to claim 4, wherein the carrier is a flexible printed circuit board.

8. The fan module according to claim 1, wherein when the sensing value is greater than a threshold value, the controller turns off the fan.

9. A fan system comprising:
a circuit board;
a fan electrically coupled to the circuit board;
a first electrostatic induction element disposed on the circuit board and adjacent to the fan; and
a controller electrically coupled to the first electrostatic induction element;
wherein when an object with static electricity gets into the first electrostatic induction element, the first electrostatic induction element outputs a sensing value to the controller, and the controller determines whether to reduce a rotating speed of the fan according to the sensing value.

10. The fan system according to claim 9, wherein when the controller determines that the sensing value is greater than a threshold value, the controller reduces the rotating speed of the fan.

11. The fan system according to claim 9, further comprising a plurality of second electrostatic induction elements, wherein the first electrostatic induction element and the second electrostatic induction elements are disposed around the fan.

12. The fan system according to claim 9, wherein the first electrostatic induction element comprises two copper foils, and the two copper foils are strip-shaped and substantially parallel with each other.

13. The fan system according to claim 12, wherein when the object with static electricity gets into a sensing area of the first electrostatic induction element, the first electrostatic induction element senses an equivalent capacitance value between the two copper foils to generate the sensing value.

14. The fan system according to claim 9, wherein the circuit board is a flexible printed circuit board.

15. The fan system according to claim 9, wherein when the sensing value is greater than a threshold value, the controller turns off the fan.

* * * * *